(12) United States Patent
Yang et al.

(10) Patent No.: US 11,599,277 B1
(45) Date of Patent: Mar. 7, 2023

(54) STORAGE SYSTEM AND METHOD FOR PERFORMING A TARGETED READ SCRUB OPERATION DURING INTENSIVE HOST READS

(71) Applicant: Western Digital Technologies, Inc., San Jose, CA (US)

(72) Inventors: Niles Yang, Mountain View, CA (US); Nan Lu, San Jose, CA (US); Piyush A. Dhotre, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 41 days.

(21) Appl. No.: 17/465,192

(22) Filed: Sep. 2, 2021

(51) Int. Cl.
*G06F 3/06* (2006.01)
*G06F 11/07* (2006.01)
*G06F 11/10* (2006.01)
*G11C 16/08* (2006.01)
*G11C 16/10* (2006.01)
*G11C 16/16* (2006.01)
*G11C 16/34* (2006.01)

(52) U.S. Cl.
CPC ............ *G06F 3/0619* (2013.01); *G06F 3/064* (2013.01); *G06F 3/0659* (2013.01); *G06F 3/0679* (2013.01); *G06F 11/076* (2013.01); *G06F 11/106* (2013.01); *G11C 16/08* (2013.01); *G11C 16/102* (2013.01); *G11C 16/16* (2013.01); *G11C 16/3427* (2013.01)

(58) Field of Classification Search
CPC ...... G06F 3/0619; G06F 3/064; G06F 3/0659; G06F 3/0679; G06F 11/076; G06F 11/106; G11C 16/08; G11C 16/102; G11C 16/16; G11C 16/3427
See application file for complete search history.

(56) References Cited

U.S. PATENT DOCUMENTS

| 9,053,808 | B2 | 6/2015 | Sprouse et al. |
| 9,349,478 | B2 | 5/2016 | Yuan et al. |
| 2019/0371416 | A1* | 12/2019 | Kuddannavar .... G11C 16/0483 |
| 2020/0226065 | A1* | 7/2020 | Yang ..................... G06F 3/0632 |

* cited by examiner

*Primary Examiner* — Kyle Vallecillo
(74) *Attorney, Agent, or Firm* — Crowell & Moring LLP

(57) ABSTRACT

A storage system determines that it is undergoing intensive reads by a host, which can occur, for example, when the storage system is being used to play a video game for a prolonged period of time. As performing a conventional read scrub operation in that situation can result in a decrease in performance, the storage system can instead use a targeted read scrub operation to reduce the impact on host read performance. The targeted read scrub operation can take the form, for example, of a periodic read scan on areas of the memory that are not part of the intensive host read, random read scans on neighboring wordlines where only a single state is read, and/or a passive read scan where acceptable but risky pages are marked for relocation.

18 Claims, 5 Drawing Sheets

US 11,599,277 B1

STORAGE SYSTEM AND METHOD FOR PERFORMING A TARGETED READ SCRUB OPERATION DURING INTENSIVE HOST READS

BACKGROUND

Data stored in a memory of a storage system may be corrupted by read, program, and erase operations to memory cells in physical proximity to those storing the data. The storage system can periodically perform a read scrub operation to correct such errors. In a read scrub operation, data is copied from one block of memory to another, so the storage system's error correction algorithm can attempt to correct accumulated errors in the block during the copy process.

DETAILED DESCRIPTION

The following embodiments are generally related to a storage system and method for performing a targeted read scrub operation during intensive host reads. In one embodiment, a storage system is presented comprising a memory and a controller. The controller is configured to determine whether the storage system is operating in an intensive-host-read mode in a portion of the memory; and in response to determining that the storage system is operating in the intensive-host-read mode in the portion of the memory, perform a targeted read scrub operation. In another embodiment, a method is provided comprising determining whether the storage system is undergoing host reads above a threshold level; in response to determining that the storage system is undergoing host reads above the threshold level, performing a targeted read scrub operation; and reallocating a page identified by the targeted read scrub operation to a new block of the memory. In yet another embodiment, a storage system is provided comprising a memory; means for determining whether the storage system is operating in an intensive-host-read mode; and means for performing a targeted read scrub operation in response to determining that the storage system is operating in the intensive-host-read mode. Other embodiments are provided, and each of these embodiments can be used alone or in combination.

Figure 1A:
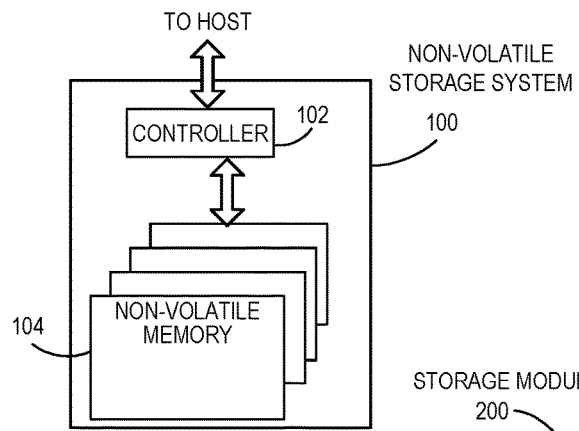
FIG. 1A is a block diagram of a non-volatile storage system of an embodiment.
Figure 1B:
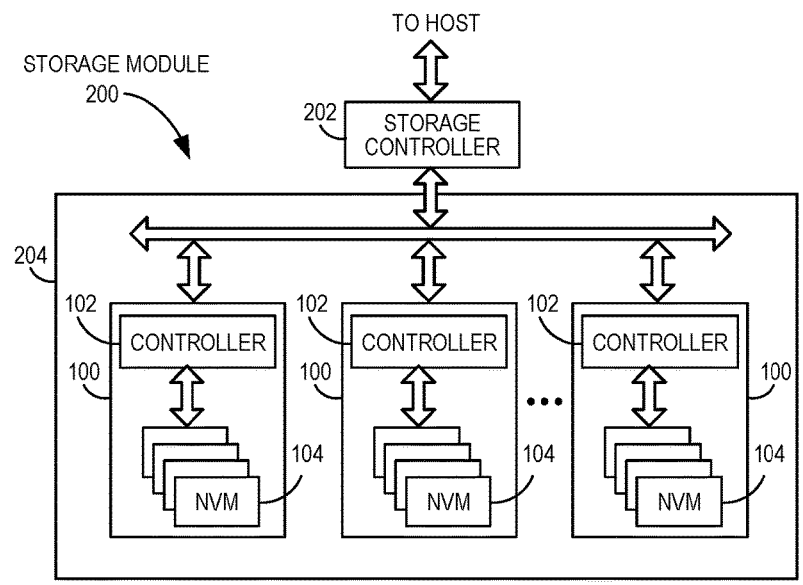
FIG. 1B is a block diagram illustrating a storage module of an embodiment.
Figure 1C:
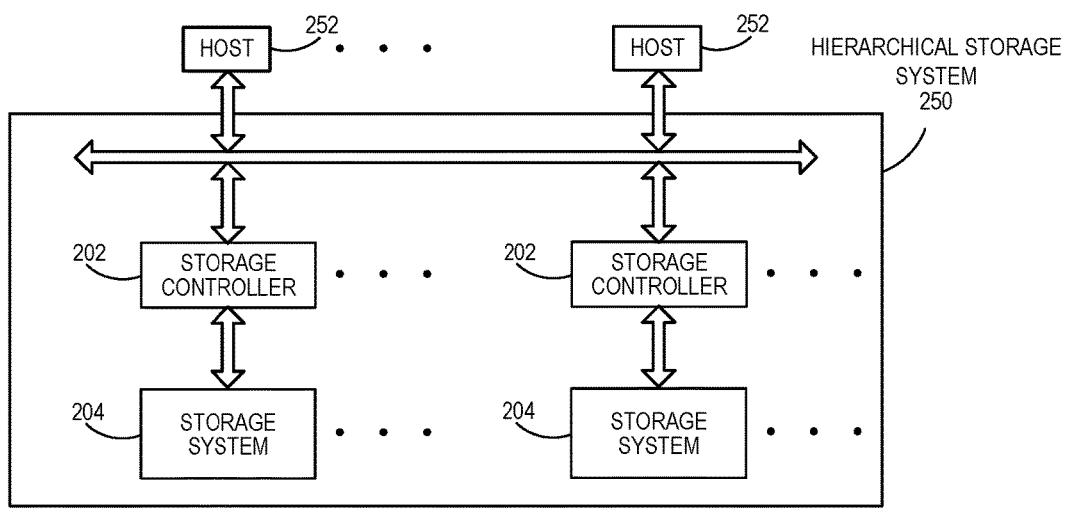
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein.

Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
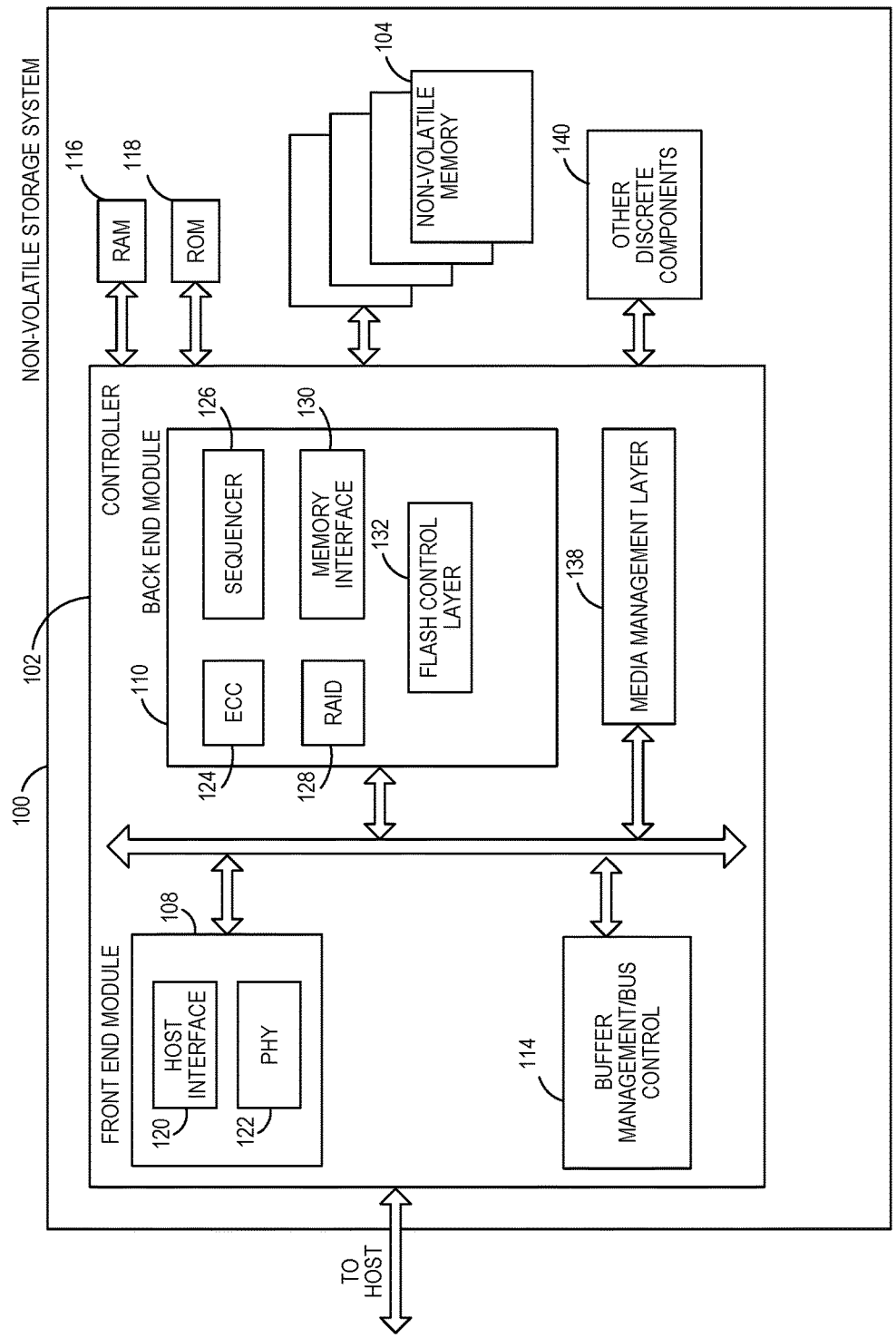
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
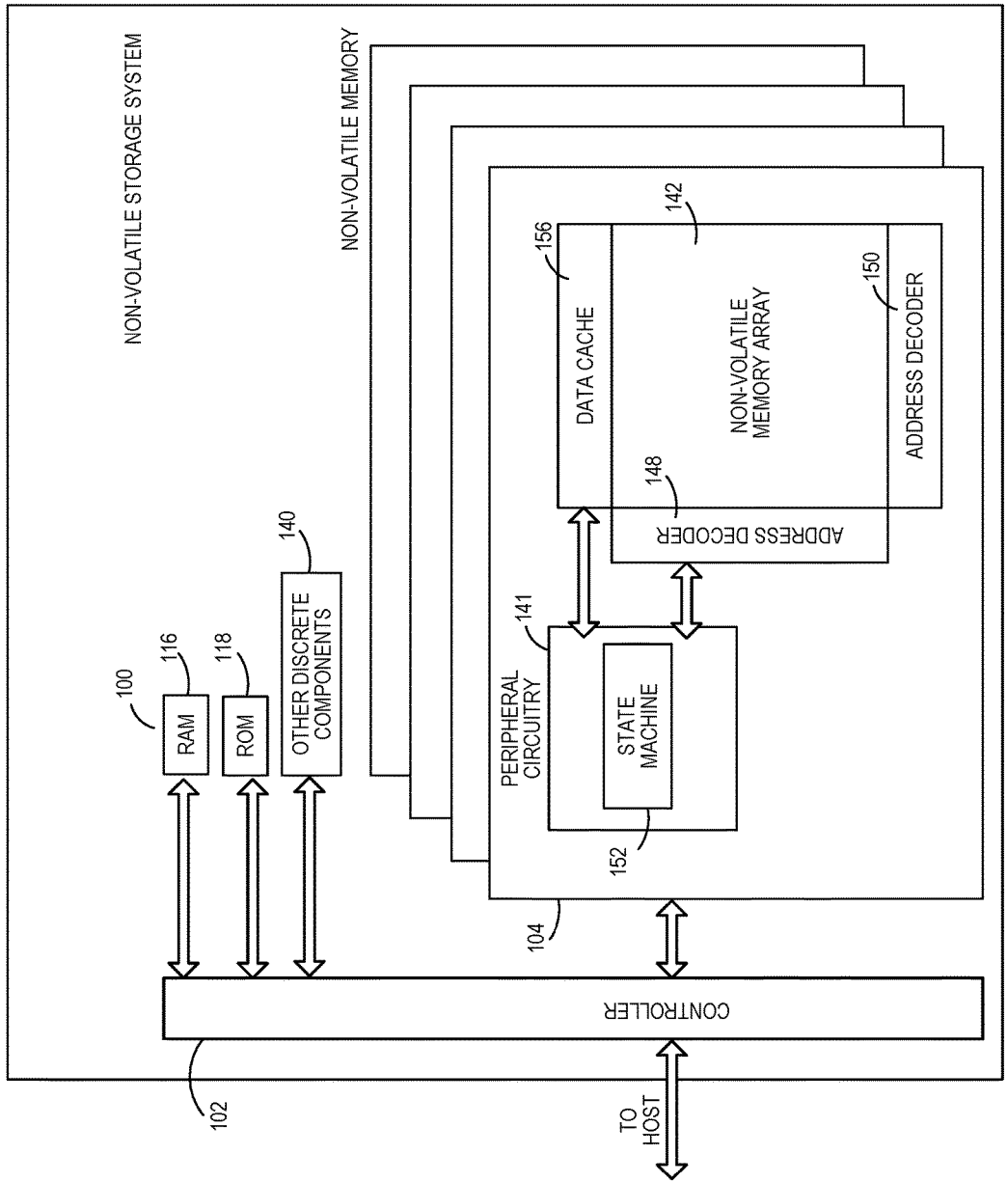
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
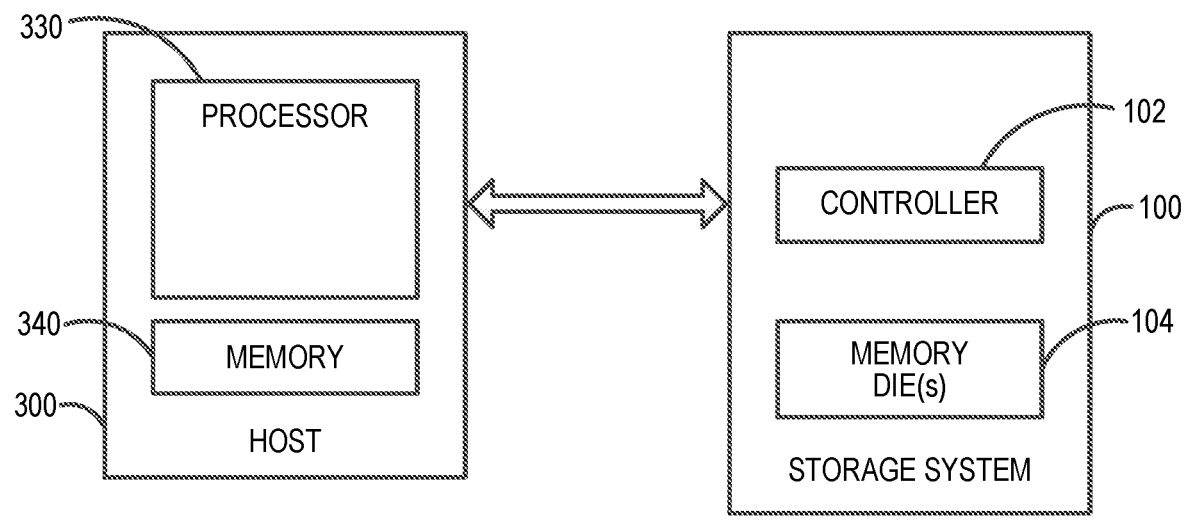
FIG. 3 is a block diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies).

As mentioned above, data stored in the memory 104 of the storage system 100 may be corrupted by read, program, and erase operations to memory cells in physical proximity to those storing the data. The storage system 100 can periodically perform a read scrub operation to correct such errors. In a read scrub operation, data is copied from one block of memory to another, so the storage system's error correction algorithm can attempt to correct accumulated errors in the block during the copy process. However, performing a periodic read scrub operation can be detrimental to the performance of the storage system 100 when the host 300 is intensively reading the memory 104.

One situation in which the host 300 may intensively read the memory 104 is when the storage system 100 stores a personal computer (PC) gaming application. In such situations, the storage system 100 (e.g., a high-speed SSD) is relied upon for high read throughput and non-interruptive gaming experiences for a prolonged period of time (e.g., six hours of non-stop read operations). However, within the storage system 100, the controller 102 may need to carry out some internal operations (either periodically or on-demand) that can interfere with the ongoing host-intensive read operations and, thus, affect the host's read performance and experience. One such operation is read scrub, where the read scan and block relocations are carried out to ensure the block bit error rate (BER) is under control.

So, for read intensive operations, such as gaming applications, the storage system 100 should have high read throughput for a prolonged period of time. However, certain system operations, such as read scrub, typically are carried out periodically, which may impact ongoing host intensive read operations, and thus affect the host read performance. Accordingly, it would be advantageous to alleviate the impact of read scrub in order to maintain host intensive read performance while still carrying out necessary storage system internal maintenance operations.

The following embodiments can be used to alleviate the impact of such read scrub operations in order to maintain host-intensive read performance while still carrying out a desired internal maintenance operation. In general, with these embodiments, a storage system determines that it is undergoing intensive reads by a host, which can occur, for example, when the storage system is being used to play a video game for a prolonged period of time. As performing a conventional read scrub operation in that situation can result in a user-noticeable decrease in performance, the storage system can use a targeted read scrub operation to reduce the impact on host read performance. The targeted read scrub operation can, for example, take the form of a periodic read scan on areas of the memory that are not part of the intensive host read, random read scans on neighboring wordlines (WLs) where only a single state is read, and/or a passive read scan where acceptable but risky pages are marked for relocation.

Figure 4:
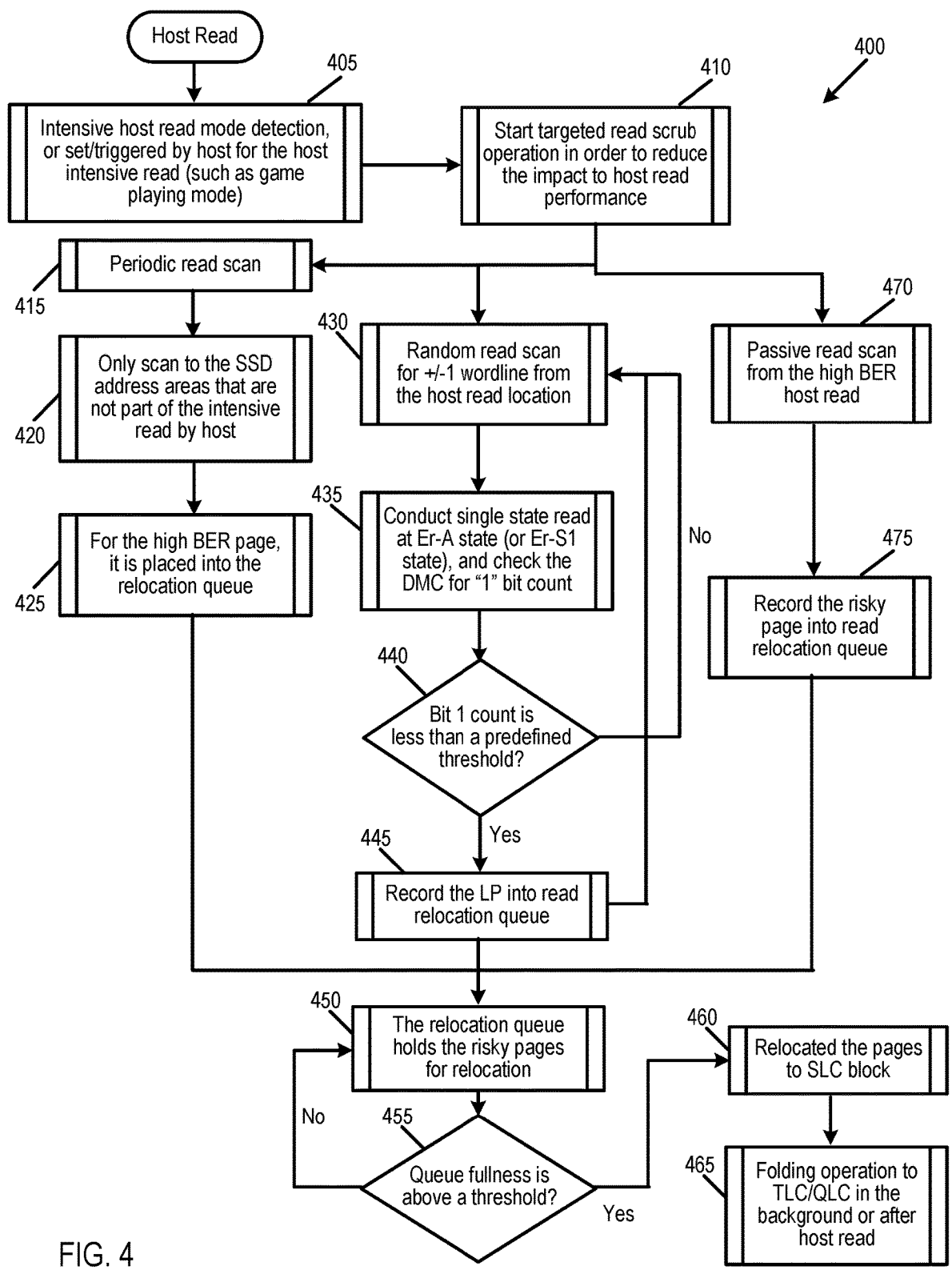
FIG. 4 is a flow chart of a method of an embodiment for performing a targeted read scrub operation.

Returning to the drawings, FIG. 4 is a flow chart 400 of a method of an embodiment for performing a targeted read scrub. As shown in FIG. 4, after the controller 102 of the storage system 100 receives a host read, the controller 102 determines if the storage system 100 is in an intensive-host-read mode (act 405). The controller 102 can make this determination in any suitable way. For example, this mode can be triggered and set by the host 300, and the controller 102 can determine if the host 300 provided such an indication to the storage system 100. As another example, the controller 102 can independently make this determination by detecting a workload of prolonged reads by the host 300 (e.g., by determining that a number of host reads over an amount of time exceeds a predetermined threshold). In one example, the intensive-host-read mode occurs when the storage system 100 is operating in a game-playing mode where host read accesses can become intensive and prolonged. It should be noted that other types of activity can place the storage system 100 in the intensive-host-read mode.

In response to determining that the storage system 100 is in the intensive-host-read mode, the controller 102 starts a targeted read scrub operation to reduce the impact to host read performance (act 410). This allows the internal read scrub function, which may be a necessary function to ensure a manageable bit error rate (BER) for the storage system 100 to operate. The targeted read scrub operation can take any form. In the particular implementation shown in FIG. 4, the targeted read scrub operation can take one or more of three operations: periodic read scan (act 415), random read scan (act 430), and passive read scan (act 470). Each of these will be discussed in more detail below. It should be noted that other operations can be used.

With the periodic read scan (act 415), the controller 102 only scans the memory address areas that are not part of the intensive read by the host 300 (act 420). In a traditional read scrub operation, the entire memory would be available for a read scrub operation within a given time frame. In contrast, with this targeted read scrub operation, the controller 102 will only read the memory locations that are not part of the host-read-intensive (e.g., game playing) addressable areas. This way, the workload is effectively reduced per given time frame for the read scan access, thus reducing the interruption of the intensive host read. For a page that has a high bit error rate (BER), the controller 102 can place the page's logical block address (LBA) and/or the page type in a relocation queue, which can be in the memory 102, in the controller 104, or elsewhere in the storage system 300 (act 425).

For the random read scan (act 430), the controller 102 reads neighboring WLs of a host-accessed WL in order to inspect the neighboring WLs for a high bit error rate. This can involve conducting a page read and then employing error correction code (e.g., low-density parity-check (LDPC)) decoding to determine if the bit error rate is too high. Further, if the memory cells in the WL comprise MLCs that can store a plurality of states, the controller 102 can read only one of those states to reduce the time needed to perform the read scan. For example, the controller 102 can read the state that represents an erased memory cell (e.g., the Er-A state) to see how many bits are 1s instead of 0s (act 435). The controller 102 can then compare the number of is found against a threshold (act 440). (Reading just the Er-A state and doing a bit count (DMC) for 1 bit reduces the memory sensing time as well as the system decoding time, thus reducing the operation overhead.) If the number is not above a threshold (e.g., 30 bits), the flow loops back to act 430. However, if the number is above the threshold, the controller 102 can record that logical page (LP), page type, and/or logical block address (e.g., of the lower page) in the relocation queue for further handling (act 445). The flow then loops back to act 430, but act 450 operates as described below.

For the passive read scan (act 470), the controller 102 performs a normal host read and determines that the bit error rate is low enough to pass system decoding but higher that a bit error rate threshold, which indicates that the page is a risky page. In this situation, the controller 102 records the page type of this triggering page (instead of the entire WL) for further handling (act 475).

As mentioned in each of the three situations discussed above, the targeted read scrub process can identify a page that needs to be relocated. In this example, the controller 102 places the logical block addresses of the pages that triggered a high bit-error-rate alert in a relocation queue (act 450). When the queue is filled above a certain threshold (act 455), the controller 102 relocates the page to another block (act 460) (i.e., the relocation queue can be counted against a fullness threshold for forced relocations). As explained above, in the relocation process, data from the page is copied from one block of memory 104 to another, and the storage system's error correction algorithm (e.g., in the controller 102) can attempt to correct accumulated errors in the block during the copy process.

To reduce the operational overhead that may impact the ongoing host intensive reads, the relocation can be done on a page or flash management unit (FMU) basis. Also, the page can be relocated to a SLC block even if the source block is a MLC block, such as a TLC block or a QLC block (act 460). Using an SLC block for the relocation operation can be much faster than using an MLC block. The SLC block can be folded to another MLC block (in the background or after a host read) later (e.g., after the game playing mode has been terminated, as the game playing mode usually only accesses part of the storage system 100) (act 465).

There are many advantages associated with these embodiments. For example, these embodiments provide an efficient system design for a game-playing mode where the host-intensive reads can be interleaved with an internal read scrub operation, and these read scrub operations can be handled differently and in a simplified way to reduce system overhead and impact on host read performance. This helps maintain system performance for intensive game playing reads and minimizes system design complexity associated with the read scrub operations. Additionally, with these embodiments, the storage system 100 can maintain the highest possible host read performance with limited risk of internal read scrub impact and bit-error-rate control.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
   a memory; and
   a controller configured to:
   determine whether the storage system is operating in an intensive-host-read mode in a portion of the memory; and
   in response to determining that the storage system is operating in the intensive- host-read mode in the portion of the memory:
   perform a targeted read scrub operation;
   place a page identified by the targeted read scrub operation for relocation in a relocation queue; and
   relocate the page in a new block of memory.

2. The storage system of claim 1, wherein the intensive-host-read mode is set by a host.

3. The storage system of claim 1, wherein the intensive-host-read mode is determined by the controller analyzing a host workload.

4. The storage system of claim 1, wherein the portion of the memory stores data of a video game.

5. The storage system of claim 1, wherein the targeted read scrub operation comprises performing a periodic read scrub operation of a different portion of the memory.

6. The storage system of claim 1, wherein the targeted read scrub operation comprises performing a random read operation of a neighboring wordline to a host-accessed wordline, and wherein the random read operation reads only one state of a plurality of states in memory cells in the neighboring wordline.

7. The storage system of claim 6, wherein the one state comprises an erased state.

8. The storage system of claim 1, wherein the targeted read scrub operation comprises performing a passive read scrub operation in which a page of memory having a number of errors below a threshold of a decoding operation but greater than a high bit-error-rate threshold is marked for relocation.

9. The storage system of claim 1, wherein the page is relocated after a fullness of the relocation queue reaches a threshold.

10. The storage system of claim 1, wherein the page is from a multi-level cell block of memory, and wherein the page is relocated to a single-level cell block of memory.

11. The storage system of claim 10, wherein the controller is further configured to fold the single-level cell block of memory into another multi-level cell block of memory.

12. The storage system of claim 1, wherein the memory comprises a three-dimensional memory.

13. In a storage system comprising a memory, a method comprising:
   determining whether the storage system is undergoing host reads above a threshold level;
   in response to determining that the storage system is undergoing host reads above the threshold level, performing a targeted read scrub operation, wherein the targeted read scrub operation comprises performing a random read operation of a neighboring wordline to a host-accessed wordline, and wherein the random read operation reads only one state of a plurality of states in memory cells in the neighboring wordline; and relocating a page identified by the targeted read scrub operation to a new block of the memory.

14. The method of claim 13, wherein the host reads are above the threshold level in response to playing a video game.

15. The method of claim 13, wherein the one state comprises an erased state.

16. A storage system comprising:

a memory;

means for determining when the storage system is operating in an intensive-host-read mode in a portion of the memory; and means for performing one of the following targeted read scrub operations in response to determining that the storage system is operating in the intensive-host-read mode in the portion of the memory:

(i) a periodic read scrub operation of a different portion of the memory, wherein a page is marked for relocation in a relocation queue as a result of the periodic read scrub operation; and (ii) a random read operation of a neighboring wordline to a host-accessed wordline, wherein the random read operation reads only one state of a plurality of states in memory cells in the neighboring wordline.

17. The method of claim 13, further comprising, prior to relocating the page to the new block of the memory, placing the page in a queue.

18. The method of claim 17, wherein the page is relocated after a fullness of the queue reaches a threshold.

\* \* \* \* \*